United States Patent
Wu (10) Patent No.: US 12,027,418 B2
(45) Date of Patent: Jul. 2, 2024

(54) SEMICONDUCTOR DEVICES AND PREPARATION METHODS THEREOF

(71) Applicant: CHANGXIN MEMORY TECHNOLOGIES, INC., Anhui (CN)

(72) Inventor: Pingheng Wu, Anhui (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 414 days.

(21) Appl. No.: 17/435,967

(22) PCT Filed: Sep. 17, 2020

(86) PCT No.: PCT/CN2020/115805
§ 371 (c)(1),
(2) Date: Sep. 2, 2021

(87) PCT Pub. No.: WO2021/143180
PCT Pub. Date: Jul. 22, 2021

(65) Prior Publication Data
US 2022/0148916 A1    May 12, 2022

(30) Foreign Application Priority Data
Jan. 17, 2020 (CN) .......................... 202010052772.5

(51) Int. Cl.
*H01L 21/768* (2006.01)
*H01L 23/528* (2006.01)
*H01L 23/535* (2006.01)

(52) U.S. Cl.
CPC .. *H01L 21/76844* (2013.01); *H01L 21/76805* (2013.01); *H01L 21/76834* (2013.01);
(Continued)

(58) Field of Classification Search
CPC ......... H01L 21/76844; H01L 21/76805; H01L 21/76834; H01L 21/76846;
(Continued)

(56) References Cited

U.S. PATENT DOCUMENTS 5,684,331 A * 11/1997 Jun .................... H01L 21/76885
257/E21.582
6,291,891 B1    9/2001 Higashi et al.
(Continued)

FOREIGN PATENT DOCUMENTS

CN    106505031 A    3/2017
CN    109545740 A    3/2019
(Continued)

OTHER PUBLICATIONS

CN109545740 (Year: 2019).*
(Continued)

*Primary Examiner* — Patricia D Valenzuela
(74) *Attorney, Agent, or Firm* — Kilpatrick Townsend & Stockton LLP (57) ABSTRACT

The present disclosure relates to a semiconductor device and a preparation method thereof. The method for preparing a semiconductor device comprises: providing a first dielectric layer; forming a first window in the first dielectric layer; forming a first connection structure in the first window; forming a second dielectric layer on the first dielectric layer, the second dielectric layer having a second window from which at least the first connection structure is exposed; forming a first barrier layer on the sidewall and bottom of the second window, the first barrier layer comprising an opening from which part of the first connection structure is exposed; and forming a second connection structure in the second window.

20 Claims, 5 Drawing Sheets

(52) U.S. Cl.
CPC .. *H01L 21/76846* (2013.01); *H01L 21/76895* (2013.01); *H01L 23/5283* (2013.01); *H01L 23/535* (2013.01); *H01L 21/76838* (2013.01); *H01L 21/76885* (2013.01)

(58) Field of Classification Search
CPC ........... H01L 21/76895; H01L 23/5283; H01L 23/535; H01L 21/76868; H01L 23/5226; H01L 21/76804; H01L 21/76885; H01L 21/76847; H01L 21/76879; H01L 21/76898; H01L 23/481; H01L 21/76838
See application file for complete search history.

(56) References Cited

U.S. PATENT DOCUMENTS

| | | |
|---|---|---|
| 6,395,627 B1 | 5/2002 | Hoshino et al. |
| 9,536,834 B2 | 1/2017 | Chou et al. |
| 2002/0058405 A1 | 5/2002 | Huang et al. |
| 2007/0120242 A1 | 5/2007 | Oh et al. |

FOREIGN PATENT DOCUMENTS

| | | |
|---|---|---|
| CN | 211017049 U | 7/2020 |
| KR | 20010058209 A | 7/2001 |

OTHER PUBLICATIONS

International Search Report dated Dec. 15, 2020 for Application No. PCT/CN2020/115805.
Extended European Search Report for EP application No. 20193458.4, mailed Jun. 14, 2022.

\* cited by examiner

SEMICONDUCTOR DEVICES AND PREPARATION METHODS THEREOF

CROSS-REFERENCE TO RELATED APPLICATIONS

The present application is an application under 35 U.S.C. 371 of International Application No. PCT/CN2020/115805 filed on Sep. 17, 2020, which claims priority to Chinese patent application 202010052772.5, titled "SEMICONDUCTOR DEVICES AND PREPARATION METHODS THEREOF", filed on Jan. 17, 2020, the contents of each of which are incorporated herein by reference in their entireties.

TECHNICAL FIELD

The present disclosure relates to the field of semiconductor manufacturing, in particular to a semiconductor device and a preparation method thereof.

BACKGROUND

Integrated circuits comprise many connection structures and the material for these connection structures is often prone to diffusion.

SUMMARY

The present disclosure provides a semiconductor device and a preparation method thereof.

The present disclosure provides a method for preparing a semiconductor device, comprising: providing a first dielectric layer; forming a first window in the first dielectric layer; forming a first connection structure in the first window; forming a second dielectric layer on the first dielectric layer, the second dielectric layer having a second window from which at least the first connection structure is exposed; forming a first barrier layer on the sidewall and bottom of the second window, the first barrier layer comprising an opening from which part of the first connection structure is exposed; and forming a second connection structure in the second window.

The present disclosure provides a semiconductor device, comprising: a first dielectric layer having a first window inside; a first connection structure located in the first window; a second dielectric layer located on the first dielectric layer, the second dielectric layer having a second window from which at least the first connection structure is exposed; a first barrier layer located on the sidewall and bottom of the second window, the first barrier layer comprising an opening from which part of the first connection structure is exposed; and a second connection structure located in the second window.

The details of one or more embodiments of the present application will be set forth in the following drawings and description. Other features and advantages of the present application will become apparent from the description, drawings and claims.

BRIEF DESCRIPTION OF THE DRAWINGS

In order to explain technical solutions of embodiments of the present application more clearly, the accompanying drawings to be used in the embodiments will be introduced simply. Apparently, the accompanying drawings to be described below are merely some embodiments of the present application. A person of ordinary skill in the art may obtain other drawings according to these drawings without paying any creative effort.

FIG. 10 is also a schematic structure diagram of the semiconductor device according to the present disclosure.

In the drawings: 10: first dielectric layer; 101: first window; 1011: inclined sidewall; 20: first connection structure; 201: first connection material layer; 202: bulge; 30: second dielectric layer; 301: second window; 40: first barrier layer; 401: opening; 50: second connection structure; 60: second barrier layer; 70: third barrier layer.

DETAILED DESCRIPTION OF THE PRESENT DISCLOSURE

As described in the background, the diffusion of the connection material into the dielectric layer may cause a short circuit and affect the yield of the device.

In order to facilitate the understanding of the present disclosure, the present disclosure will be described more fully below with reference to the relevant drawings. Preferred embodiments of the present disclosure are shown in the drawings. However, the present disclosure may be implemented in many different forms and is not limited to the embodiments described herein. On the contrary, these embodiments are provided to make the disclosure of the present disclosure more thorough and comprehensive.

Unless otherwise defined, all technical and scientific terms used herein have the same meaning as commonly understood by a person of ordinary skill in the art to which the present disclosure belongs. Here, terms used in the description of the present disclosure are merely intended to describe specific embodiments, rather than limiting the present disclosure. As used herein, the term "and/or" includes any or all of one or more associated listed items or combinations thereof.

In the description of the present disclosure, it should be understood that orientations or location relationships indicated by terms such as "upper", "lower", "vertical", "horizontal", "inner", "outer" are the directions and the location relationships illustrated on the basis of the drawings, and used just for convenience of describing the present disclosure and simplifying the description, rather than indicating or implying that the apparatuses or elements must have a specific orientation and be constructed and operated in the specific orientation, and therefore shall not be considered as any limitations to the present disclosure.

Figure 1:
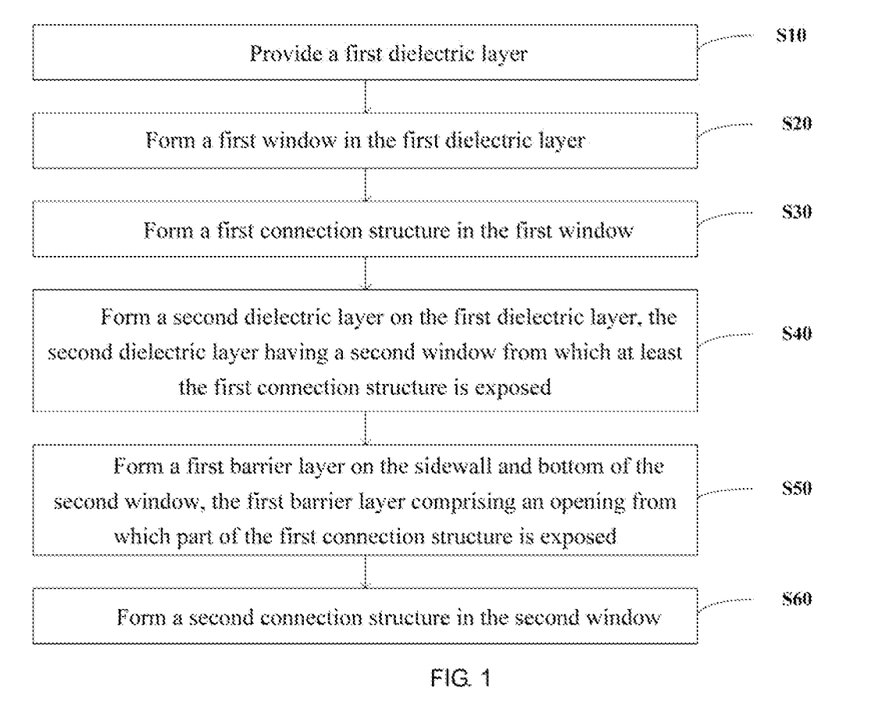
FIG. 1 is a flowchart of a method for preparing a semiconductor device according to the present disclosure.

In one embodiment, as shown in FIG. 1, a method for preparing a semiconductor device is provided, comprising: providing a first dielectric layer 10; forming a first window 101 in the first dielectric layer 10; forming a first connection structure 20 in the first window 101; forming a second dielectric layer 30 on the first dielectric layer 10, the second dielectric layer 30 having a second window 301 from which at least the first connection structure 20 is exposed; forming a first barrier layer 40 on the sidewall and bottom of the second window 301, the first barrier layer 40 comprising an opening 401 from which part of the first connection structure 20 is exposed; and forming a second connection structure 50 in the second window 301.

In this embodiment, the method for preparing a semiconductor device can prevent the diffusion of the second connection material into the first dielectric layer 10 and the second dielectric layer 30, and also can improve the electrical conduction efficiency between the first connection structure 20 and the second connection structure 50. The formation of the first barrier layer 40 on the sidewall and bottom of the second window 301 can prevent the diffusion of the second connection material into the first dielectric layer 10 and the second dielectric layer 30. The first barrier layer 40 comprises an opening 401 from which part of the first connection structure 20 is exposed, so that the first connection structure 20 can directly contact with the second connection structure 50. Thus, the resistance between the first connection structure 20 and the second connection structure 50 is reduced. Therefore, the electrical conduction efficiency between the first connection structure 20 and the second connection structure 50 can be improved, and the performance of the device can be improved.

Figure 2:
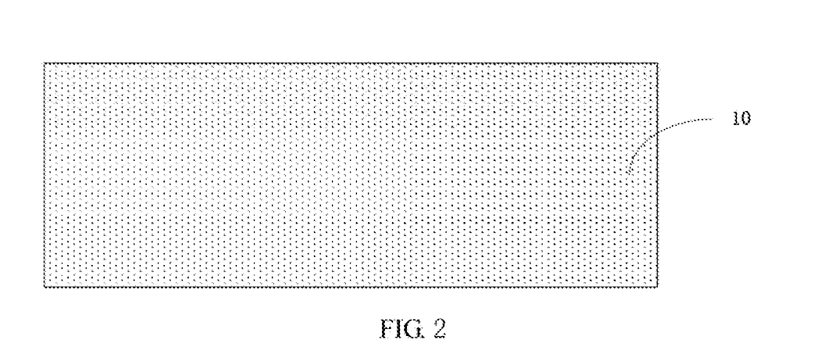
FIG. 2 to FIG. 10 are schematic structure diagrams of steps of the method for preparing a semiconductor device according to the present disclosure; among them.

S10: As shown in FIG. 2, a first dielectric layer 10 is provided.

In this embodiment, the method for forming the first dielectric layer 10 comprises physical vapor deposition, chemical vapor deposition, or atomic layer deposition. The material for the first dielectric layer 10 comprises one or more of silicon oxide, silicon nitride, and silicon oxynitride.

In one embodiment. S10 comprises: providing a substrate. The first dielectric layer 10 is formed on an upper surface of the substrate.

Figure 3:
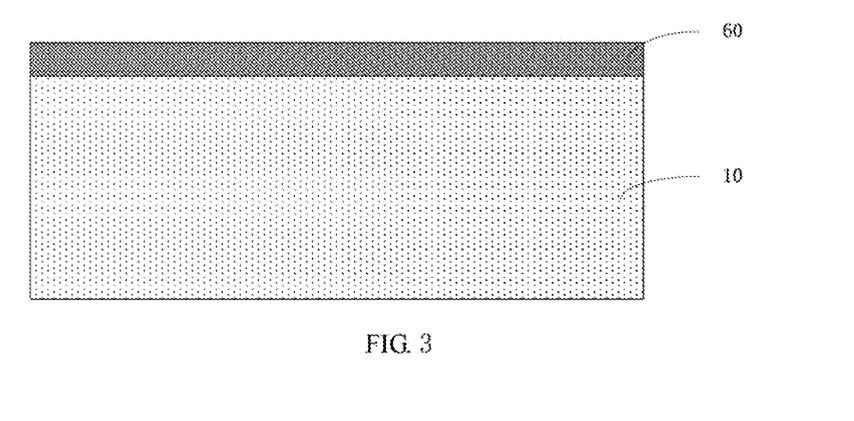

In one embodiment, after S10, the method further comprises: S11: As shown in FIG. 3, a second barrier layer 60 is formed on the surface of the first dielectric layer 10.

In one embodiment, the method for forming the second barrier layer 60 comprises physical vapor deposition, chemical vapor deposition, or atomic layer deposition. The material for the second barrier layer 60 comprises one or more of silicon nitride, silicon oxynitride, silicon carbide, silicon carbonitride, and silicon oxycarbide.

In this embodiment, the formation of the second barrier layer 60 on the surface of the first dielectric layer 10 can prevent the diffusion of the second connection material into the first dielectric layer 10 due to the existence of the opening 401, thereby further reducing the risk of diffusion. The second barrier layer 60 can be used as an etching barrier layer when forming the second window 301 to improve the uniformity of etching. The second barrier layer 60 can be used as a polishing barrier layer when forming the first connection structure 20, so that the excess first connection material layer 201 can be removed more completely and scratches can be reduced.

Figure 4:
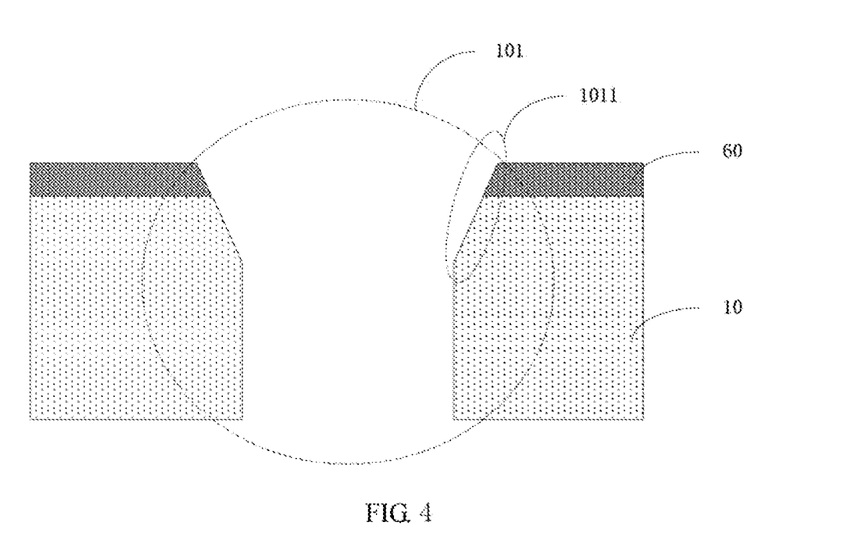

S20: As shown in FIG. 4, a first window 101 is formed in the first dielectric layer 10.

In this embodiment, the method of forming the first window 101 comprises dry etching or wet etching, wherein it is easier to form the inclined sidewall 1011 by wet etching.

In one embodiment, a first window 101 is formed in the first dielectric layer 10 and the second barrier layer 60, and the first window 101 penetrates the first dielectric layer 10 and the second barrier layer 60. At least the sidewall of the upper part of the first window 101 is an inclined sidewall.

In another embodiment. S20 comprises:

S201: forming a through hole in the first dielectric layer 10;

S202: filling the first connection material layer 201 in the through hole; and

S203: removing, by etching, part of the first connection material layer 201 and part of the first dielectric layer 10 to form the first window 101.

In one embodiment, at least the sidewall of the upper part of the first window 101 is an inclined sidewall.

In one embodiment, the shape of the first window 101 comprises a funnel shape. The shape of the first window 101 comprises a funnel shape. When the first connection structure 20 is formed, the first connection material layer 201 is first filled in the first window 101, and then the excess first connection material layer 201 is removed by flattening process. During the flattening process, since the first window 101 is funnel-shaped, the edges of the upper surface of the formed first connection structure 20 have a bulge 202. Thus, when the first barrier layer 40 is formed, an annular opening 401 is formed on the first barrier layer 40 at the bulge 202, so that the first connection structure 20 can directly contact with the second connection structure 50. Thus, the resistance between the first connection structure 20 and the second connection structure 50 is reduced. Therefore, the electrical conduction efficiency between the first connection structure 20 and the second connection structure 50 can be improved and the performance of the device can be improved.

S30: A first connection structure 20 is formed in the first window 101.

In one embodiment, a first connection structure 20 is formed in the first window 101. The top of the first connection structure 20 is higher than the upper surface of the second barrier layer 60, the upper surface of the first connection structure 20 and the upper surface of the second barrier layer 60 have an overlapped portion, that is, the first connection structure 20 has a bulge 202.

Figure 5:
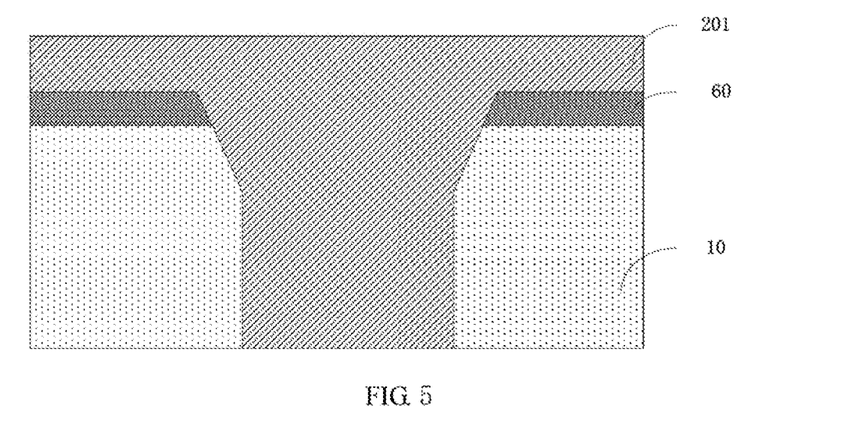
Figure 6:
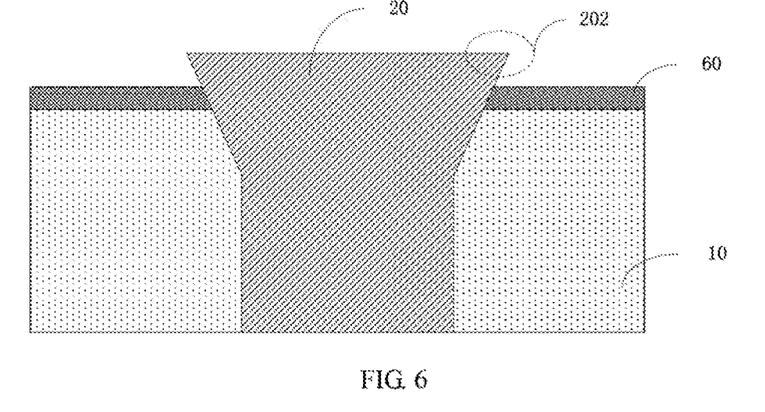

In one embodiment, S30 comprises:

S301: as shown in FIG. 5, depositing a first connection material layer 201 in the first window 101 and on the first dielectric layer 10; and S302: as shown in FIG. 6, removing, by flattening process, the first connection material layer 201 on the first dielectric layer 10 to form the first connection structure 20.

In one embodiment, at least the sidewall of the upper part of the first window 101 is an inclined sidewall, so that the interface between the first connection structure 20 and the first dielectric layer 10 comprises a bulge 202.

In one embodiment, the first window 101 is funnel-shaped, a first connection material layer 201 is formed in the first window 101 and on the first dielectric layer 10, and then the first connection material layer 201 on the first dielectric layer 10 is removed by flattening process to form the first connection structure 20. In this case, since the interface between the first connection material layer 201 and the first dielectric layer 10 is not vertical but a slope with a gradient and the first connection material layer 201 and the first dielectric layer 10 are made of different materials, the flattening process will result in the formation of a bulge 202 on the upper surface of the first connection structure 20. The bulge 202 refers to a protruded portion at the edges of the upper surface of the first connection structure 20. The protruded portion is located above the first dielectric layer 10 and there is a gap between the protruded portion and the first dielectric layer 10. The protruded portion and the first dielectric layer 10 have an overlapped region.

In this embodiment, the method for depositing the first connection material layer 201 comprises physical vapor deposition, chemical vapor deposition, or atomic layer deposition. The first connection material layer 201 comprises one or more of copper, aluminum, nickel, gold, silver, titanium and tungsten. The flattening process comprises chemical mechanical polishing (CMP).

In this embodiment, the interface between the first connection structure 20 and the first dielectric layer 10 comprises a bulge 202. Specifically, the bulge 202 refers to a protruded portion of the upper part of the first connection structure 20, which is protruded above the first dielectric layer 10. The sidewall of the protruded portion is an inclined sidewall, and the inclined sidewall is inclined at an angle of less than 90° with respect to an upper surface of the first dielectric layer 10. The sidewall of the first window 101 comprises an inclined sidewall 1011. When the first connection structure 20 is formed, the first connection material layer 201 is first filled in the first window 101, and then the excess first connection material layer 201 is removed by flattening process. During the flattening process, since the sidewall of the first window 101 has an inclined sidewall 1011, the formed first connection structure 20 has a bulge 202.

In one embodiment, the first connection structure 20 comprises a bulge 202 formed at the interface between the first connection structure 20 and the first dielectric layer 10 so that the first barrier layer 40 comprises an opening 401. The first connection structure 20 comprises a bulge 202.

Figure 7:
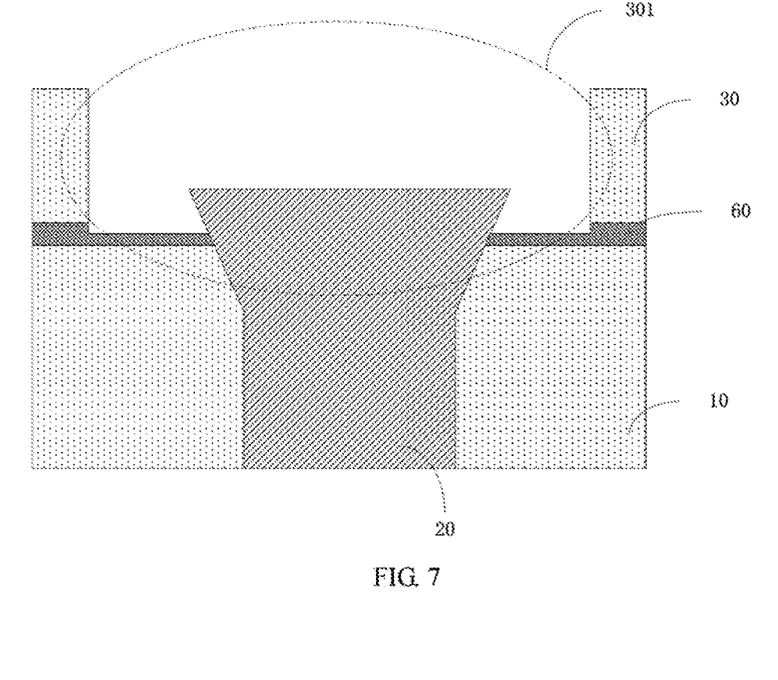

S40: As shown in FIG. 7, a second dielectric layer 30 is formed on the first dielectric layer 10. The second dielectric layer 30 has a second window 301 from which at least the first connection structure 20 is exposed.

In this embodiment, the method for forming the second dielectric layer 30 comprises physical vapor deposition, chemical vapor deposition, or atomic layer deposition. The material for the second dielectric layer 30 comprises one or more of silicon oxide, silicon nitride, and silicon oxynitride.

In one embodiment, a second dielectric layer 30 is formed on the upper surface of the second barrier layer 60. The second dielectric layer 30 has a second window 301 from which at least the first connection structure 20 is exposed.

In one embodiment, S40 comprises:

S401: forming a second dielectric layer 30 on the first dielectric layer 10; and S402: forming a second window 301 in the second dielectric layer 30, from which at least the first connection structure 20 is exposed.

In one embodiment, the second barrier layer 60 is used as an etching barrier layer when S402 is performed, to improve the uniformity of etching.

In one embodiment, when the second window 301 is formed in the second dielectric layer 30, a part of the thickness of the second barrier layer 60 is also removed, and the thickness of the removed second barrier layer 60 accounts for 10% to 60% of the thickness of the second barrier layer 60.

Figure 8:
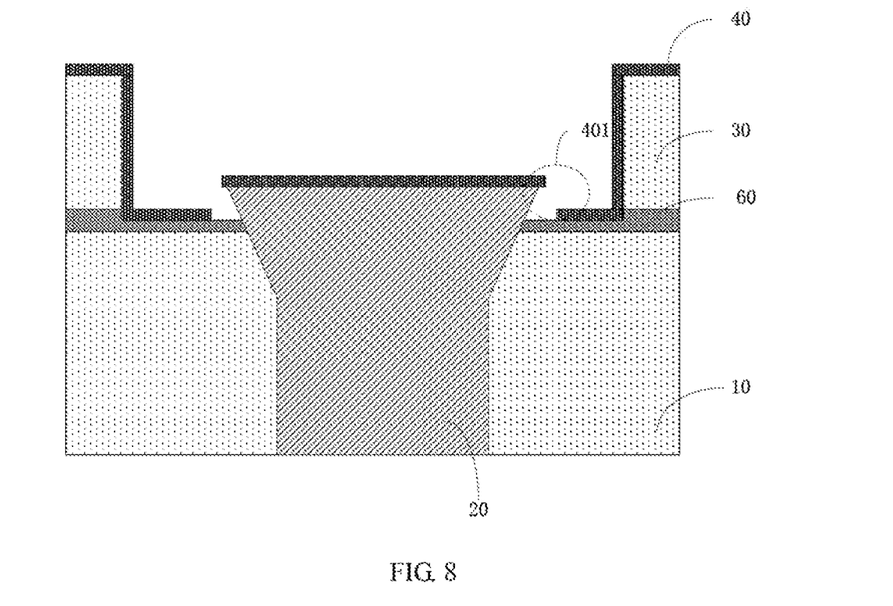

S50: As shown in FIG. 8, a first barrier layer 40 is formed on the sidewall and bottom of the second window 301. The first barrier layer 40 comprises an opening 401 from which part of the first connection structure 20 is exposed.

In this embodiment, the method for forming the first barrier layer 40 comprises chemical vapor deposition, physical vapor deposition or atomic layer deposition. The material for the first barrier layer 40 comprises one or more of titanium, tantalum, tungsten, titanium nitride, tantalum nitride and tungsten nitride.

In one embodiment, the first barrier layer 40 is formed on the upper surface of the first connection structure 20, the exposed upper surface of the second barrier layer 60, and the sidewall of the second window 301, and the first barrier layer 40 comprises an opening 401 from which part of the first connection structure 20 is exposed. The first barrier layer 40 on the upper surface of the first connection structure 20 and the first barrier layer 40 on the upper surface of the second barrier layer 60 are not in a same horizontal plane, and there is a gap between them, i.e., the opening 401.

In one embodiment, the shape of the opening 401 comprises a ring shape, and the opening 401 is located at the interface between the first connection structure 20 and the first dielectric layer 10.

In another embodiment, the opening 401 is located at the interface between the first connection structure 20 and the second barrier layer 60.

Figure 9:
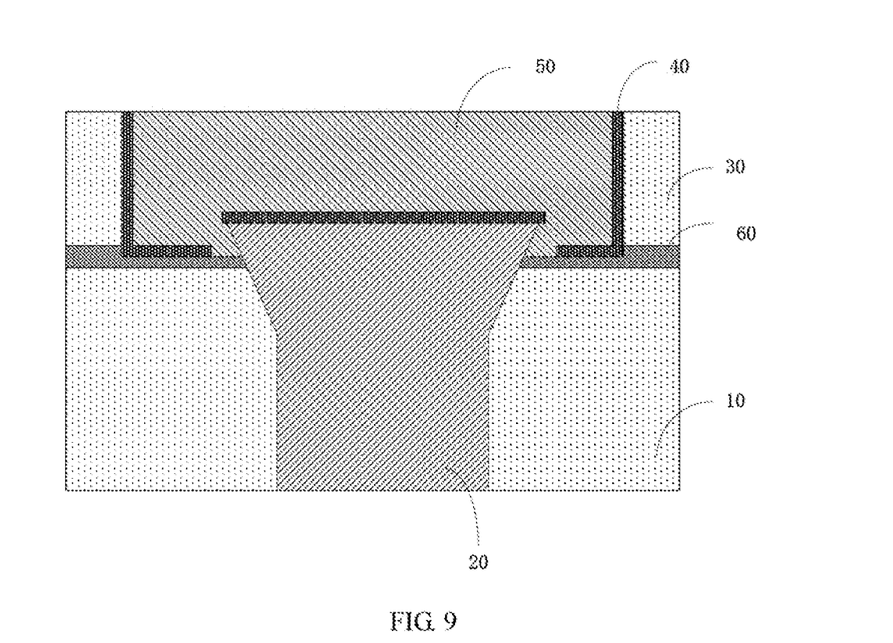

S60: As shown in FIG. 9, a second connection structure 50 is formed in the second window 301.

In this embodiment, the method for forming the second connection structure 50 comprises chemical vapor deposition, physical vapor deposition, or atomic layer deposition. The material for the second connection structure 50 comprises one or more of copper, aluminum, nickel, gold, silver, titanium and tungsten. Optionally, the material for the second connection structure 50 is copper.

In one embodiment, S60 comprises:

S601: forming a second connection material in the second window 301 and on the surface of the first barrier layer 40; and S602: removing, by flattening process, the second connection material on the surface of the second barrier layer 60 to form a second connection structure 50.

In one embodiment, the interface between the first connection structure 20 and the first dielectric layer 10 comprises a bulge 202. Specifically, the bulge 202 refers to a protruded portion of the upper part of the first connection structure 20, which is protruded above the first dielectric layer 10. The sidewall of the protruded portion is an inclined sidewall, and the inclined sidewall is inclined at an angle of less than 90° with respect to an upper surface of the first dielectric layer 10. The sidewall of the first window 101 comprises an inclined sidewall 1011. When the first connection structure 20 is formed, the first connection material layer 201 is first filled in the first window 101, and then the excess first connection material layer 201 is removed by flattening process. During the flattening process, since the sidewall of the first window 101 has an inclined sidewall 1011, the formed first connection structure 20 has a bulge 202. Thus, when the first barrier layer 40 is formed, an opening 401 is formed on the first barrier layer 40 at the bulge 202 and the first barrier layer 40 does not exist on the inclined sidewall 1011, so that the first connection structure 20 can directly contact with the second connection structure 50. Thus, the resistance between the first connection structure 20 and the second connection structure 50 is reduced. Therefore, the electrical conduction efficiency between the first connection structure 20 and the second connection structure 50 can be improved and the performance of the device can be improved.

In one embodiment, the first window 101 is funnel-shaped, the first connection material layer 201 is formed in the first window 101 and on the first dielectric layer 10, and then the first connection material layer 201 on the first dielectric layer 10 is removed by flattening process to form the first connection structure 20. In this case, since the interface between the first connection material layer 201 and the first dielectric layer 10 is not vertical but a slope with a gradient and the material for the first connection material layer 201 is different from the material for the first dielectric layer 10, the flattening process will result in the formation of a bulge 202 on the upper surface of the first connection structure 20. The bulge 202 refers to a protruded portion at the edges of the upper surface of the first connection structure 20. The protruded portion is located above the first dielectric layer 10 and there is a gap between the protruded portion and the first dielectric layer 10. The protruded portion and the first dielectric layer 10 have an overlapped region. Then, the second dielectric layer 30 is formed on the first dielectric layer 10, and the second dielectric layer 30 has a second window 301. Then, the first barrier layer 40 is deposited. In this case, due to the existence of the bulge 202, there is a height difference between the protruded portion and the first dielectric layer 10. In this case, there is a first barrier layer 40 on the upper surface of the protruded portion and the upper surface of the first dielectric layer 10, but there is no first barrier layer 40 on the first dielectric layer 10 directly below the protruded portion. In this case, the portion below the protruded portion of the first connection structure 20 is exposed. Then, the second connection structure 50 is formed in the second window 301. In this case, the second connection structure 50 can directly contact with the first connection structure 20. In this way, the resistance between the first connection structure 20 and the second connection structure 50 can be reduced, the electrical conduction efficiency can be improve, and the performance of the device can be improved.

In this embodiment, the formation of the first barrier layer 40 on the sidewall and bottom of the second window 301 can prevent the diffusion of the second connection material into the first dielectric layer 10 and the second dielectric layer 30. The first barrier layer 40 comprises an opening 401 from which the first connection structure 20 is exposed, so that the first connection structure 20 can directly contact with the second connection structure 50. Thus, the resistance between the first connection structure 20 and the second connection structure 50 is reduced. Therefore, the electrical conduction efficiency between the first connection structure 20 and the second connection structure 50 can be improved, and the performance of the device can be improved.

In one embodiment, the first barrier layer 40 does not have an opening 401 but has a thin layer region. In this case, the resistance between the first connection structure 20 and the second connection structure 50 can also be reduced. Therefore, the electrical conduction efficiency between the first connection structure 20 and the second connection structure 50 can be improved, and the performance of the device can be improved. This thin layer region is also an opening 401, and this solution is also within the protection scope of the present disclosure.

In one embodiment, the second communication material is prone to diffusion. The diffusion of the second communication material into the first dielectric layer 10 and the second dielectric layer 30 may cause a short circuit and affect the performance of the device. The first barrier layer 40 can prevent the diffusion of the second connection material into the first dielectric layer 10 and the second dielectric layer 30. However, the first barrier layer 40 can increase the contact resistance between the first connection structure 20 and the second connection structure 50. The opening 401 can enable the direct contact between the first connection structure 20 and the second connection structure 50, which solves the above-mentioned problem. Thus, the resistance between the first connection structure 20 and the second connection structure 50 is reduced. Therefore, the electrical conduction efficiency between the first connection structure 20 and the second connection structure 50 is improved, and the performance of the device is improved.

Figure 10:
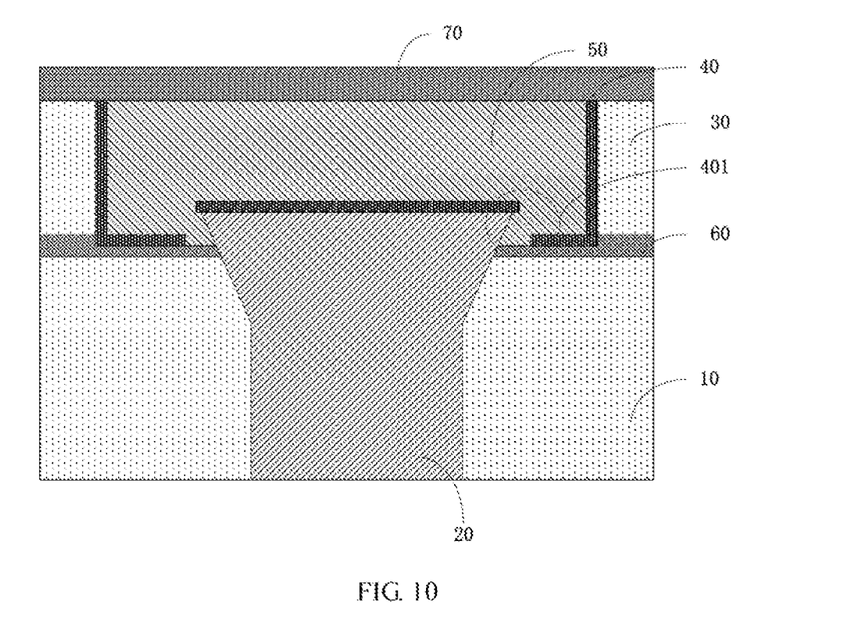

In one embodiment, after S60, the method further comprises:

S70: As shown in FIG. 10, a third barrier layer 70 is formed on the second connection structure 50.

In one embodiment, the method for forming the third barrier layer 70 comprises chemical vapor deposition, physical vapor deposition or atomic layer deposition. The material for the third barrier layer 70 comprises one or more of silicon nitride, silicon oxynitride, silicon carbide, silicon carbonitride, and silicon oxycarbide.

In one embodiment, as shown in FIG. 10, a semiconductor device is provided, comprising: a first dielectric layer 10 having a first window 101 therein; a first connection structure 20 located in the first window 101; a second dielectric layer 30 located on the first dielectric layer 10, the second dielectric layer 30 having a second window 301 from which at least the first connection structure 20 is exposed; a first barrier layer 40 located on the sidewall and bottom of the second window 301, the first barrier layer 40 comprising an opening 401 from which the first connection structure 20 is exposed; and a second connection structure 50 located in the second window 301.

In this embodiment, the semiconductor device can prevent the diffusion of the second connection material into the first dielectric layer 10 and the second dielectric layer 30, and also can improve the electrical conduction efficiency between the first connection structure 20 and the second connection structure 50. The formation of the first barrier layer 40 on the sidewall and bottom of the second window 301 can prevent the diffusion of the second connection material into the first dielectric layer 10 and the second dielectric layer 30. The first barrier layer 40 comprises an opening 401 from which the first connection structure 20 is exposed, so that the first connection structure 20 can directly contact with the second connection structure 50. Thus, the resistance between the first connection structure 20 and the second connection structure 50 is reduced. Therefore, the electrical conduction efficiency between the first connection structure 20 and the second connection structure 50 can be improved, and the performance of the device can be improved.

In this embodiment, the material for the first dielectric layer 10 comprises one or more of silicon oxide, silicon nitride, and silicon oxynitride. The material for the second barrier layer 60 comprises one or more of silicon nitride, silicon oxynitride, silicon carbide, silicon carbonitride, and silicon oxycarbide.

In one embodiment, the semiconductor device further comprises: a second barrier layer 60 located on the surface of the first dielectric layer 10, the upper surface of the second barrier layer 60 being lower than the top of the first connection structure 20; and the first window 101 penetrates the second barrier layer 60 and the first dielectric layer 10. The formation of the second barrier layer 60 on the surface of the first dielectric layer 10 can prevent the diffusion of the second connection material into the first dielectric layer 10 due to the existence of the opening 401, thereby further reducing the risk of diffusion. The second barrier layer 60 can be used as an etching barrier layer when forming the second window 301 to improve the uniformity of etching. The second barrier layer 60 can be used as a polishing barrier layer when forming the first connection structure 20, so that the excess first connection material layer 201 can be removed more completely and scratches can be reduced.

In one embodiment, at least the sidewall of the upper part of the first window 101 is an inclined sidewall, so that the interface between the first connection structure 20 and the first dielectric layer 10 comprises a bulge 202. The sidewall of the first window 101 comprises an inclined sidewall 1011. When the first connection structure 20 is formed, the first connection material layer 201 is first filled in the first window 101, and then the excess first connection material layer 201 is removed by flattening process. During the flattening process, since the sidewall of the first window 101 has an inclined sidewall 1011, the formed first connection structure 20 has a bulge 202. Thus, when the first barrier layer 40 is formed, an opening 401 is formed on the first barrier layer 40 at the bulge 202, so that the first connection structure 20 can directly contact with the second connection structure 50. Thus, the resistance between the first connection structure 20 and the second connection structure 50 is reduced. Therefore, the electrical conduction efficiency between the first connection structure 20 and the second connection structure 50 can be improved and the performance of the device can be improved.

In one embodiment, the shape of the first window 101 comprises a funnel shape. The shape of the first window 101 comprises a funnel shape. When the first connection structure 20 is formed, the first connection material layer 201 is first filled in the first window 101, and then the excess first connection material layer 201 is removed by flattening process. During the flattening process, since the first window 101 is funnel-shaped, the edges of the upper surface of the formed first connection structure 20 have a bulge 202. Thus, when the first barrier layer 40 is formed, an annular opening 401 is formed on the first barrier layer 40 at the bulge 202, so that the first connection structure 20 can directly contact with the second connection structure 50. Thus, the resistance between the first connection structure 20 and the second connection structure 50 is reduced. Therefore, the electrical conduction efficiency between the first connection structure 20 and the second connection structure 50 can be improved and the performance of the device can be improved.

In this embodiment, the first connection material layer 201 comprises one or more of copper, aluminum, nickel, gold, silver, titanium and tungsten.

In one embodiment, the first connection structure 20 comprises a bulge 202 located at the interface between the first connection structure 20 and the first dielectric layer 10, so that the first barrier layer 40 comprises an opening 401. The first connection structure 20 comprises a bulge 202. When the first barrier layer 40 is formed, an opening 401 is formed on the first barrier layer 40 at the bulge 202, so that the first connection structure 20 can directly contact with the second connection structure 50. Thus, the resistance between the first connection structure 20 and the second connection structure 50 is reduced. Therefore, the electrical conduction efficiency between the first connection structure 20 and the second connection structure 50 can be improved and the performance of the device can be improved.

In this embodiment, the interface between the first connection structure 20 and the first dielectric layer 10 comprises a bulge 202. Specifically, the bulge 202 refers to a protruded portion of the upper part of the first connection structure 20, which is protruded above the first dielectric layer 10. The sidewall of the protruded portion is an inclined sidewall, and the inclined sidewall is inclined at an angle of less than 90° with respect to an upper surface of the first dielectric layer 10.

In this embodiment, the material for the second dielectric layer 30 comprises one or more of silicon oxide, silicon nitride, and silicon oxynitride.

In this embodiment, the material for the first barrier layer 40 comprises one or more of titanium, tantalum, tungsten, titanium nitride, tantalum nitride, and tungsten nitride.

In this embodiment, the formation of the first barrier layer 40 on the sidewall and bottom of the second window 301 can prevent the diffusion of the second connection material into the first dielectric layer 10 and the second dielectric layer 30. The first barrier layer 40 comprises an opening 401 from which the first connection structure 20 is exposed, so that the first connection structure 20 can directly contact with the second connection structure 50. Thus, the resistance between the first connection structure 20 and the second connection structure 50 is reduced. Therefore, the electrical conduction efficiency between the first connection structure 20 and the second connection structure 50 can be improved, and the performance of the device can be improved.

In one embodiment, the shape of the opening 401 comprises a ring shape, and the opening 401 is located at the interface between the first connection structure 20 and the first dielectric layer 10.

In one embodiment, the first barrier layer 40 does not have an opening 401 but has a thin layer region. In this case, the resistance between the first connection structure 20 and the second connection structure 50 can also be reduced. Therefore, the electrical conduction efficiency between the first connection structure 20 and the second connection structure 50 can be improved, and the performance of the device can be improved. This thin layer region also belongs to the opening 401, and this solution is also within the protection scope of the present disclosure.

In one embodiment, the second communication material is prone to diffusion. The diffusion of the second communication material into the first dielectric layer 10 and the second dielectric layer 30 may cause a short circuit and affect the performance of the device. The first barrier layer 40 can prevent the diffusion of the second connection material into the first dielectric layer 10 and the second dielectric layer 30. However, the first barrier layer 40 can increase the contact resistance between the first connection structure 20 and the second connection structure 50. The opening 401 can enable the direct contact between the first connection structure 20 with the second connection structure 50, which solves the above-mentioned problem. Thus, the resistance between the first connection structure 20 and the second connection structure 50 is reduced. Therefore, the electrical conduction efficiency between the first connection structure 20 and the second connection structure 50 is improved, and the performance of the device is improved.

In this embodiment, the material for the second connection structure 50 comprises one or more of copper, aluminum, nickel, gold, silver, titanium, and tungsten. Optionally, the material for the second connection structure 50 is copper.

In one embodiment, the semiconductor device further comprises: a third barrier layer 70 located on the second connection structure 50. The material for the third barrier layer 70 comprises one or more of silicon nitride, silicon oxynitride, silicon carbide, silicon carbonitride, and silicon oxycarbide.

In one embodiment, the first connection structure 20 and the second barrier layer 60 have an overlapped portion.

In one embodiment, the first barrier layer 40 is located on the upper surface of the first connection structure 20, an upper surface of part of the second barrier layer 60 at the bottom of the second window 301, and the sidewall of the second window 301, and the bottom of the first barrier layer 40 on the upper surface of the first connection structure 20 is higher than the top of the first barrier layer 40 on the upper surface of the second barrier layer 60.

In one embodiment, the upper surface of the second barrier layer 60 in the second window 301 has a recess, and the depth of the recess accounts for 10% to 60% of the thickness of the second barrier layer 60.

Various technical features of the above embodiments can be arbitrarily combined. For simplicity, not all possible combinations of various technical features of the above embodiments are described. However, all those technical features shall be included in the protection scope of the present disclosure if not conflict.

The embodiments described above merely represent certain implementations of the present disclosure. Although those embodiments are described in more specific details, it is not to be construed as any limitation to the scope of the present disclosure. It should be noted that, for a person of ordinary skill in the art, a number of variations and improvements may be made without departing from the concept of the present disclosure, and those variations and improvements should be regarded as falling into the protection scope of the present disclosure. Therefore, the protection scope of the present disclosure should be subject to the appended claims.

The invention claimed is:

1. A method for preparing a semiconductor device, comprising:
   providing a first dielectric layer;
   forming a first window in the first dielectric layer;
   forming a first connection structure in the first window;
   forming a second dielectric layer on the first dielectric layer, the second dielectric layer having a second window from which at least an upper surface and part of sidewall of the first connection structure is exposed;
   forming a first barrier layer on the sidewall and bottom of the second window, the first barrier layer comprising an opening from which part of the first connection structure is exposed; and
   forming a second connection structure in the second window.

2. The method for preparing a semiconductor device according to claim 1, wherein the first connection structure comprises a bulge formed at an interface between the first connection structure and the first dielectric layer, so that the first barrier layer comprises the opening.

3. The method for preparing a semiconductor device according to claim 2, wherein at least the sidewall of an upper part of the first window is an inclined sidewall, so that the interface between the first connection structure and the first dielectric layer comprises the bulge.

4. The method of preparing a semiconductor device according to claim 3, wherein a shape of the first window comprises a funnel shape.

5. The method for preparing a semiconductor device according to claim 3, wherein forming the first window in the first dielectric layer comprises:
   forming a through hole in the first dielectric layer;
   filling a first connection material layer in the through hole; and
   removing by etching part of the first connection material layer and part of the first dielectric layer to form the first window.

6. The method for preparing a semiconductor device according to claim 3, wherein the inclined sidewall is inclined at an angle of less than 90° with respect to an upper surface of the first dielectric layer.

7. The method for preparing a semiconductor device according to claim 1, before forming the first window in the first dielectric layer, further comprising: forming a second barrier layer on a surface of the first dielectric layer, an upper surface of the second barrier layer being lower than top of the first connection structure.

8. The method for preparing a semiconductor device according to claim 1, wherein a shape of the opening comprises a ring shape, and the opening is located at an interface between the first connection structure and the first dielectric layer.

9. The method for preparing a semiconductor device according to claim 7, wherein forming the second dielectric layer on the first dielectric layer, the second dielectric layer having the second window from which at least the upper surface and part of sidewall of the first connection structure is exposed, comprises:
   removing a part of thickness of the second barrier layer, and the thickness of the removed second barrier layer accounts for 10% to 60% of the thickness of the second barrier layer.

10. The method of preparing a semiconductor device according to claim 1, wherein the first barrier layer has a thin layer region.

11. A semiconductor device, comprising:
    a first dielectric layer having a first window inside;
    a first connection structure located in the first window;
    a second dielectric layer located on the first dielectric layer, the second dielectric layer having a second window from which at least an upper surface and part of sidewall of the first connection structure is exposed;
    a first barrier layer located on the sidewall and bottom of the second window, the first barrier layer comprising an opening from which part of the first connection structure is exposed; and
    a second connection structure located in the second window.

12. The semiconductor device according to claim 11, wherein the first connection structure comprises a bulge located at an interface between the first connection structure and the first dielectric layer, so that the first barrier layer comprises the opening.

13. The semiconductor device according to claim 12, wherein at least a sidewall of an upper part of the first window is an inclined sidewall, so that the interface between the first connection structure and the first dielectric layer comprises the bulge.

14. The semiconductor device according to claim 13, wherein a shape of the first window comprises a funnel shape, a shape of the opening comprises a ring shape, and the opening is located at the interface between the first connection structure and the first dielectric layer.

15. The semiconductor device according to claim 13, wherein the inclined sidewall is inclined at an angle of less than 90° with respect to an upper surface of the first dielectric layer.

16. The semiconductor device according to claim 11, further comprising: a second barrier layer located on a surface of the first dielectric layer, the upper surface of the second barrier layer being lower than top of the first connection structure; and the first window penetrates the second barrier layer and the first dielectric layer.

17. The semiconductor device according to claim 16, wherein the first connection structure and the second barrier layer have an overlapped portion.

18. The semiconductor device according to claim 16, wherein the first barrier layer is located on an upper surface of the first connection structure, an upper surface of part of the second barrier layer at the bottom of the second window, and a sidewall of the second window, and bottom of the first barrier layer on the upper surface of the first connection structure is higher than top of the first barrier layer on the upper surface of the second barrier layer.

19. The semiconductor device according to claim 16, wherein a part of thickness of the second barrier layer is removed, and the thickness of the removed second barrier layer accounts for 10% to 60% of the thickness of the second barrier layer.

20. The semiconductor device according to claim 11, wherein the first barrier layer has a thin layer region.

\* \* \* \* \*